(12) United States Patent
Lee et al.

(10) Patent No.: US 9,601,842 B2
(45) Date of Patent: Mar. 21, 2017

(54) CONNECTING UNIT HAVING A COLUMN WITH A PLURALITY OF PLANAR ELASTIC FINS EXTENDING FROM THE COLUMN

(71) Applicants: Unid Co., Ltd., Seoul (KR); OCI Corporation, Seoul (KR)

(72) Inventors: Dong Su Lee, Seoul (KR); Chong Kwang Yoon, Seongnam-si (KR); Hyeong Seok Lee, Gwangmyeong-si (KR); Kwang Hoon Sohn, Cheonan-si (KR)

(73) Assignees: Unid Co., Ltd., Seoul (KR); OCI Corporation, Seoul (KR)

( * ) Notice: Subject to any disclaimer, the term of this patent is extended or adjusted under 35 U.S.C. 154(b) by 0 days.

(21) Appl. No.: 14/901,729

(22) PCT Filed: Aug. 21, 2013

(86) PCT No.: PCT/KR2013/007500
§ 371 (c)(1),
(2) Date: Dec. 29, 2015

(87) PCT Pub. No.: WO2015/020258
PCT Pub. Date: Feb. 12, 2015

(65) Prior Publication Data
US 2016/0149318 A1    May 26, 2016

(30) Foreign Application Priority Data
Aug. 6, 2013  (KR) .................. 10-2013-0092966

(51) Int. Cl.
*H01R 12/00* (2006.01)
*H01R 4/48* (2006.01)
(Continued)

(52) U.S. Cl.
CPC ......... *H01R 4/4809* (2013.01); *H01R 9/2458* (2013.01); *H01R 12/7082* (2013.01);
(Continued)

(58) Field of Classification Search
CPC ....................................................... H05K 1/18
(Continued)

(56) References Cited

U.S. PATENT DOCUMENTS 6,159,021 A * 12/2000 Kusuhara ............. H01R 12/716
439/74
6,524,115 B1 * 2/2003 Gates ................... G01R 1/0408
439/66

(Continued)

FOREIGN PATENT DOCUMENTS

JP     54-099093    7/1979
JP     05-251125    9/1993
(Continued)

OTHER PUBLICATIONS

Decision to Grant a Patent Dated Nov. 23, 2014 From the Korean Intellectual Property Office Re. Application No. 10-2013-0092966.
(Continued)

*Primary Examiner* — Chandrika Prasad

(57) ABSTRACT

The present invention discloses a matable and dematable electrical connecting structure characterized by comprising: a female coupling member having a first connecting portion; a male coupling member having a second connecting portion; and a connecting unit coupling the female coupling member and the male coupling member and electrically connecting the first and second connecting portions, wherein the connecting unit includes an inner conductive material which is electrically connected to the first connecting portion and is provided on the inner wall of an insert hole formed in the female connecting member, a column includ-
(Continued)

ing a conductive material which is electrically connected to the second connecting portion, protruding from the male connecting member, and can be inserted in the insert hole, and one or more elastic pin including a surface of a conductive material which is extending in an outward direction from the column and elastically contacting the inner conductive material.

39 Claims, 8 Drawing Sheets

(51) Int. Cl.
  *H01R 13/24* (2006.01)
  *H01R 12/70* (2011.01)
  *H01R 13/20* (2006.01)
  *H01R 9/24* (2006.01)
  *H05K 1/18* (2006.01)

(52) U.S. Cl.
  CPC ......... *H01R 13/20* (2013.01); *H01R 13/2414* (2013.01); *H05K 1/18* (2013.01)

(58) Field of Classification Search
  USPC ............................ 439/65, 66, 69, 74, 620.15
  See application file for complete search history.

(56) References Cited

U.S. PATENT DOCUMENTS

| | | | |
|---|---|---|---|
| 6,729,890 B2 | 5/2004 | Shin | |
| 7,074,070 B1 | 7/2006 | Huang et al. | |
| 2007/0111600 A1* | 5/2007 | Tokunaga | H01R 12/58 439/607.01 |
| 2008/0144301 A1* | 6/2008 | Konishi | H01R 12/58 361/803 |
| 2009/0233465 A1* | 9/2009 | Mizoguchi | H01R 12/58 439/74 |
| 2011/0059631 A1* | 3/2011 | Tamura | H01R 12/7082 439/66 |
| 2012/0045909 A1* | 2/2012 | Pischler | H01L 23/49811 439/74 |
| 2012/0276788 A1* | 11/2012 | Takano | H01R 24/50 439/784 |
| 2013/0171876 A1* | 7/2013 | Funahashi | H01R 24/50 439/620.03 |
| 2013/0244486 A1* | 9/2013 | Ohsaka | H01R 12/57 439/581 |
| 2015/0222034 A1* | 8/2015 | Tatebe | H01R 12/714 439/626 |

FOREIGN PATENT DOCUMENTS

| | | |
|---|---|---|
| JP | 2003-323924 | 11/2003 |
| KR | 10-1999-0066675 | 8/1999 |
| WO | WO 2015/020258 | 2/2015 |

OTHER PUBLICATIONS

International Search Report Dated May 14, 2014 From the Korean Intellectual Property Office Re. Application No. PCT/KR2013/007500 and Its Translation Into English.
Notice of Grounds of Rejection Dated May 14, 2014 From the Korean Intellectual Property Office Re. Application No. 10-2013-0092966.
Notice of Reasons for Rejection Dated Nov. 29, 2016 From the Japan Patent Office Re. Application No. 2016-521176 and Its Translation Into English. (5 Pages).
Notification of Office Action and Search Report Dated Dec. 19, 2016 From the State Intellectual Property Office of the People's Republic of China Re. Application No. 201380077939.1 and Its Translation Into English. (15 Pages).

* cited by examiner

CONNECTING UNIT HAVING A COLUMN WITH A PLURALITY OF PLANAR ELASTIC FINS EXTENDING FROM THE COLUMN

RELATED APPLICATIONS

This application is a National Phase of PCT Patent Application No. PCT/KR2013/007500 having International filing date of Aug. 21, 2013, which claims the benefit of priority of Korean Patent Application No. 10-2013-0092966 filed on Aug. 6, 2013. The contents of the above applications are all incorporated by reference as if fully set forth herein in their entirety.

FIELD AND BACKGROUND OF THE INVENTION

The present invention relates to a matable and dematable electrical connecting structure for electrical interconnection of a printed circuit board (PCB), an interposer, an electronic package, and a connector, or electrical connection between the inside and outside thereof.

An electrical connecting structure is essential for connecting a printed circuit board (PCB) to electronic parts (for example, semiconductor packages, passive elements, active elements, display modules, batteries, etc.) installed above, below and inside the PCB, or connecting the PCB to another PCB.

In recent years, much research on electrical connecting structures has been attempted for the purpose of manufacturing various electronic devices on a small and slim scale through changes in structure of electrical connecting structures as the miniaturization and slimming of various electronic devices such as various portable telephones, display devices, and the like rapidly progress.

The electrical connecting structures for interconnection of all electronic parts in an electric circuit are classified into two categories: solder-bonding- and socket-type electrical connecting structures. Solder bonding is widely used in most electrical connecting methods, but the reassembly of parts is required during a surface mounting or part assembling process. The socket-type electrical connecting structure and method are used when there is a large number of inputs/outputs (I/O), and a matable and dematable mode is essential.

Either of these electrical connecting structures may be used to realize the miniaturization and slimming of the electronic devices by manufacturing the electronic devices with a fine pitch, a small thickness and a small area. However, the electrical connecting structures have a problem in that they have a reduced probability of stably maintaining mechanical durability and reliability with an increase in the number of I/o and a decrease in the pitch or thickness. For example, as a connector for connection between substrates is manufactured in a small scale, the probability of a connector being poorly mounted on the substrate may increase due to solder connection between adjacent terminals when the connectors are mounted on a surface of the substrate by means of solder bonding. Also, the probability of an electrical connection between female connectors and male connectors being disconnected due to external impacts may increase.

Accordingly, to solve the above problems, a matable and dematable electrical connecting structure that is electrically and mechanically stable and enables electronic parts to be lightweight, thin and simple by realizing a fine pitch and a decrease in thickness and area is highly required.

SUMMARY OF THE INVENTION

The present invention is designed to solve the problems of the prior art, and therefore it is an object of the present invention to provide a matable and dematable electrical connecting structure capable of realizing a fine pitch, enabling a decrease in thickness and area, and stably maintaining electrical connection and mechanical reliability.

To solve the above problems, one aspect of the present invention provides a matable and dematable electrical connecting structure, characterized in that the matable and dematable electrical connecting structure includes a female coupling member having a first connecting portion, a male coupling member having a second connecting portion, and a connecting unit configured to couple the female coupling member and the male coupling member and electrically connect the first and second connecting portions. Here, the connecting unit includes an inner conductive material electrically connected to the first connecting portion and provided on the inner wall of an insert hole formed in the female connecting member, a column electrically connected to the second connecting portion, protruding from the male connecting member to be inserted into the insert hole, and including a conductive material, and one or more elastic fins extending outward from the column to come in elastic contact with the inner conductive material and having a surface made of a conductive material.

In this case, the elastic fins may be configured to be bent in a direction opposite to an insertion direction of the column when the column is inserted. Also, the elastic fins may be formed of an elastically deformable conductive material, or formed by coating a surface of an elastically deformable material with a conductive material.

The plurality of elastic fins may be arranged at an outer circumference of the column to be spaced apart at a predetermined angle. Also, the elastic fin may be formed as a fin in one circular shape or other shapes with no spacing angle.

The insert hole may have a shape such that the insert hole is recessed to a predetermined depth from one surface of the female coupling member, or may have a shape of a through hole passing though the female coupling member.

The column may be configured to include a central conductive material, a first insulating layer formed on an outer circumference of the central conductive material, and an outer conductive layer formed on an outer circumference of the first insulating layer, and each of the elastic fins may be configured to include one or more signal fins connected to the central conductive material, and one or more ground fins connected to the outer conductive layer.

The signal fin and the ground fin may be alternately disposed to be spaced apart at a predetermined angle in outer circumferential directions of the central conductive material and the outer conductive material, and the inner conductive material provided on the inner wall of the insert hole formed in the female coupling member may be configured to include first and second conductive materials positioned at positions corresponding to the signal fin and the ground fin, respectively, and disposed to be spaced apart from each other at a predetermined interval. Here, the first and second conductive materials may be formed on recesses formed on an inner circumference of the insert hole.

The column may be configured to further include a second insulating layer formed on an outer circumference of the outer conductive layer, and the outermost conductive layer formed on an outer circumference of the second insulating layer, and each of the elastic fins may be configured to further include one or more power fins for transfer of electric power connected to the outermost conductive layer.

A retainer configured to hang the elastic fins upon insertion of the column may be further formed at an entrance of the insert hole. Further, a clamp configured to clamp external surfaces of the female coupling member and the male coupling member to fix a coupled state of the female coupling member and the male coupling member may be further applied to the female coupling member and the male coupling member.

A plurality of projections configured to project from the inner wall of the inner conductive material so that unevenness is formed on the inner wall of the inner conductive material may be formed at the inner conductive material.

Each of the female coupling member and the male coupling member may include at least one selected from the group consisting of an active element, a passive element, a connector, an interposer applied to semiconductor packages, a semiconductor chip package, a semiconductor chip and package in the form of a 3D stacked structure shape, and a multilayered ceramic capacitor (MLCC).

Meanwhile, another aspect of the present invention provides a connector for electrical connection configured to electrically connect a first substrate and a second substrate, characterized in that the connector includes a female coupling member having a first connecting portion electrically connected to the first substrate, a male coupling member having a second connecting portion electrically connected to the second substrate, and a connecting unit configured to couple the female coupling member and the male coupling member, and electrically connect the first and second connecting portions. Here, the connecting unit includes an inner conductive material electrically connected to the first connecting portion and provided on the inner wall of an insert hole formed in the female coupling member, a column electrically connected to the second connecting portion, protruding from the male connecting member to be inserted into the insert hole, and including a conductive material, and one or more elastic fins extending outward from the column to come in elastic contact with the inner conductive material and having a surface made of a conductive material.

Still another aspect of the present invention provides a semiconductor package assembly including a semiconductor package including a semiconductor element and a package substrate on which the semiconductor element is mounted, a main board on which the semiconductor package is mounted, and a connecting unit configured to couple the semiconductor package and the main board and electrically connect a circuit of the substrate and a circuit of the main board. Here, the connecting unit includes an inner conductive material electrically connected to the circuit of the substrate and provided on the inner wall of an insert hole formed in the substrate, a column electrically connected to the circuit of the main board, protruding from the main board to be inserted into the insert hole, and including a conductive material, and one or more elastic fins extending outward from the column to come in elastic contact with the inner conductive material, and having a surface made of a conductive material.

Still another aspect of the present invention provides a semiconductor package assembly including a semiconductor package including a semiconductor element and a package substrate on which the semiconductor element is mounted, a main board on which the semiconductor package is mounted, an interposer installed between the semiconductor package and the main board and configured to connect a circuit of the substrate and a circuit of the main board, and a connecting unit configured to couple the interposer and the main board and electrically connect the circuit of the interposer and the circuit of the main board. Here, the connecting unit includes an inner conductive material electrically connected to the circuit of the interposer and provided on the inner wall of an insert hole formed in the interposer, a column electrically connected to the circuit of the main board, protruding from the main board to be inserted into the insert hole, and including a conductive material, and one or more elastic fins extending outward from the column to come in elastic contact with the inner conductive material and having a surface made of a conductive material.

Still another aspect of the present invention provides a semiconductor package assembly including a semiconductor package including a semiconductor element and a package substrate on which the semiconductor element is mounted, a main board on which the semiconductor package is mounted, first and second interposers installed between the semiconductor package and the main board and configured to connect a circuit of the substrate and a circuit of the main board, and a connecting unit configured to couple the first interposer and the second interposer and electrically connect a circuit of the first interposer and a circuit of the second interposer. Here, the connecting unit includes an inner conductive material electrically connected to the circuit of the first interposer and provided on the inner wall of an insert hole formed in the first interposer, a column electrically connected to the circuit of the second interposer, protruding from the second interposer to be inserted into the insert hole, and including a conductive material, and one or more elastic fins extending outward from the column to come in elastic contact with the inner conductive material and having a surface made of a conductive material.

Yet another aspect of the present invention provides an electronic device including a housing configured to form the exterior of the electronic device, and one of the matable and dematable electrical connecting structure, the connector for electrical connection, and the semiconductor package assembly, all of which are configured as described above, and installed inside the housing.

According to the above-described configuration according to one exemplary embodiment of the present invention, many electrical connecting structures can be disposed by realizing inputs/outputs (I/O) with an array shape in a narrow space, and a fine pitch between the connecting structures can also be realized.

Also, the electrical connecting structures have advantages in that the connecting structures can be reassembled since the connecting structures are in a matable and dematable type (i.e., a matable socket type), and an electrical connecting portion is configured as an elastic fin, and the electronic part assembly has very high mechanical reliability and impact resistance.

In addition, when the electrical connecting structure according to one exemplary embodiment of the present invention is used in a method of electrically connecting upper and lower portions of a chip in a 3D chip package, the electrical connecting structure has no concern regarding fatigue fracture often occurring at a through silicon via (TSV) portion that is a drawback of TSV. Also, when the electrical connecting structure is used in a method of electrically connecting upper and lower portions of a 3D package-on-package (PoP), reliability and reassembly in a vertical connecting unit can be improved.

Unlike a structure of a typical connector, the total size and thickness of the electrical connecting structure can also be reduced, and the manufacturing cost can be cut by realizing the connecting structure on a female coupling member and a male coupling member without performing plastic molding and fin insertion processes. As described above, the electrical connecting structure exhibits a high electrical signal transmission rate and excellent signal quality since the electrical connecting structure has a low height and is closer to a line.

Further, the electrical connecting structure has advantages in that the electrical connecting structure has improved electrical signal quality since the electrical connecting structure has a function of a coaxial cable in which an electrical signal line is surrounded by a ground line, and the manufacturing cost can be cut by reducing the total number of I/O.

DESCRIPTION OF SPECIFIC EMBODIMENTS OF THE INVENTION

The electrical connecting structure disclosed herein is used to denote the concept of encompassing structures for electrical connection between printed circuit boards (PCBs), electrical connection between electronic parts installed in a PCB, and electrical connection between the PCBs and the electronic parts. Such an electrical connecting structure is applicable to various electronic devices such as various portable telephones, display devices, and the like. In this case, the electrical connecting structure according to one exemplary embodiment of the present invention, a connector for electrical connection, and a semiconductor package assembly to which the electrical connecting structure is applied may be provided in a housing configured to form the exterior of an electronic device. By way of example, the electrical connecting structure may include a structure in which a PCB installed inside the housing is electrically connected to electronic parts installed in the PCB.

Hereinafter, the matable and dematable electrical connecting structure relevant to the present invention, and a connector for electrical connection, a semiconductor package assembly and an electronic device, all of which include the matable and dematable electrical connecting structure, will be described in further detail with reference to the accompanying drawings.

Figure 1:
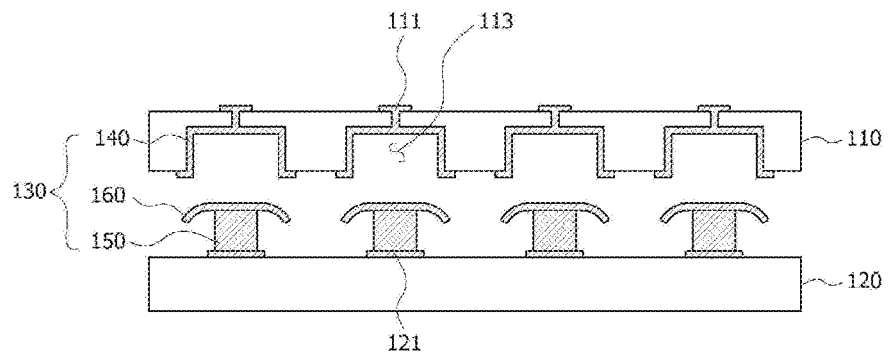
FIGS. 1 and 2 are cross-sectional views of an electrical connecting structure according to a first exemplary embodiment of the present invention.
Figure 2:
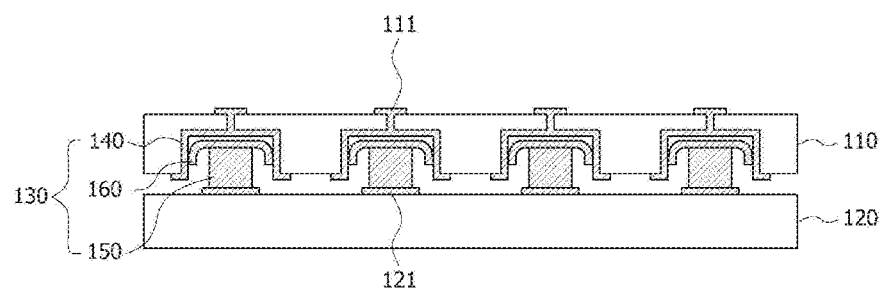

FIGS. 1 and 2 are cross-sectional views of a matable and dematable electrical connecting structure according to a first exemplary embodiment of the present invention. The connecting structure according to this exemplary embodiment may be referred to as a non-coaxial-type connecting structure.

Referring to FIGS. 1 and 2, the matable and dematable electrical connecting structure according to this exemplary embodiment includes a female coupling member 110, a male coupling member 120, and a connecting unit 130.

The female coupling member 110 and the male coupling member 120 have a female/male structure for electrical/physical connection between PCBs or parts installed in the PCBs. FIG. 1 shows the female coupling member 110 and the male coupling member 120 in a separated state, and FIG. 2 shows the female coupling member 110 and the male coupling member 120 in a coupled state.

The female coupling member 110 and the male coupling member 120 may be configured to be coupled by means of the female/male structure. In this case, the female coupling member 110 and the male coupling member 120 may be formed on the PCB itself, and may be single parts installed in the PCB. For example, the female coupling member 110 or the male coupling member 120 may include at least one selected from the group consisting of an active element, a passive element, a connector, an interposer applied to semiconductor packages, a semiconductor chip package, a semiconductor chip and package in the form of a 3D stacked structure, and a multilayered ceramic capacitor (MLCC).

The female coupling member 110 and the male coupling member 120 may be formed of an insulating material, or a combination of an insulating material and a conductive material. The female coupling member 110 and the male coupling member 120 may be made of at least one material selected from the group consisting of a ceramic, a polymer, silicone, glass, a metal, and a combination thereof.

The female coupling member 110 and the male coupling member 120 include a first connecting portion and a second connecting portion, respectively. The first connecting portion and the second connecting portion according to one exemplary embodiment of the present invention refer to targets that are electrically connected to each other by connection between the female coupling member 110 and the male coupling member 120. Examples of the female coupling member 110 and the male coupling member 120 include a pad, a circuit pattern, a bump, a solder ball, a via hole, and the like. According to this exemplary embodiment, a pad 111 formed on a top surface of the female coupling member 110 may be used as one example of the first connecting portion, and a circuit pattern (not shown) coupled to a pad 121 formed on a top surface of the male coupling member 120 may be used as one example of the second connecting portion.

The connecting unit 130 serves to physically couple the female coupling member 110 and the male coupling member 120, and electrically connect the first connecting portion and the second connecting portion as well. In this case, the connecting unit 130 is configured to include an inner conductive material 140, a column 150, and one or more elastic fins 160.

Figure 5:
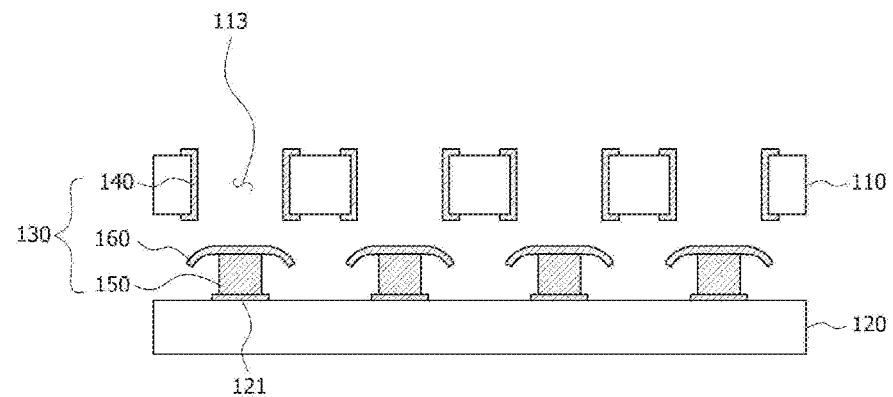
FIG. 5 shows other exemplary embodiments of configurations of an insert hole and an inner conductive material.

The inner conductive material 140 is provided on the inner wall of an insert hole 113 formed in the female coupling member 110. According to this exemplary embodiment, the insert hole 113 has a shape such that the insert hole 113 is recessed to a predetermined depth from one surface (a bottom surface shown in FIGS. 1 and 2) of the female coupling member 110, and has a shape such that the insert hole 113 is recessed in a cylindrical shape. In addition to such a shape, however, the insert hole 113 may have a shape of a through hole passing though the female coupling member 110 as shown in FIG. 5.

The inner conductive material 140 may have a shape such that the inner conductive material 140 is formed to a predetermined thickness on an inner sidewall of the insert hole 113, and may be formed by means of a process such as plating, or coating. According to this exemplary embodiment, the inner conductive material 140 may be formed around the inner sidewall of the insert hole 113.

The inner conductive material 140 is made of a conductive material (for example, a metal material), and is electrically connected to the first connecting portion. The exemplary embodiment shown in FIGS. 1 and 2 illustrates that the inner conductive material 140 passes through the female coupling member 110 to be connected to a pad 111 through a bottom portion of the insert hole 113, and FIG. 5 illustrates that the inner conductive material 140 passes through the female coupling member 110 to be connected to a circuit pattern formed on a top surface of the female coupling member 110.

The column 150 is configured to include a conductive material, and has a structure such that the column 150 projects from the male coupling member 120. The column 150 itself may be formed of a conductive material, or only an outer portion of the column 150 may be formed of a conductive material, and an inner portion of the column 150 may be formed of a non-conductive material. As one example of the latter, the column 150 may have a structure in which the inner portion of the column 150 is formed of a material such as a polymer, silicone, and glass, and only the outer portion of the column 150 is formed of a conductive material. The column 150 is configured to be inserted into the insert hole 113 of the female coupling member 110 when the female coupling member 110 faces the male coupling member 120, as shown in FIG. 2. The column 150 is electrically connected to the second connecting portion of the male coupling member 120. This exemplary embodiment illustrates that the column 150 is installed in the pad 121 connected to the circuit pattern.

The inner conductive material 140 and the column 150 may be arranged in the form of matrix array in which a predetermined number of rows and columns are provided on the female coupling member 110 and the male coupling member 120. Here, the number of columns, the number of rows, or a shape of the array may be realized in various forms.

Figure 3:
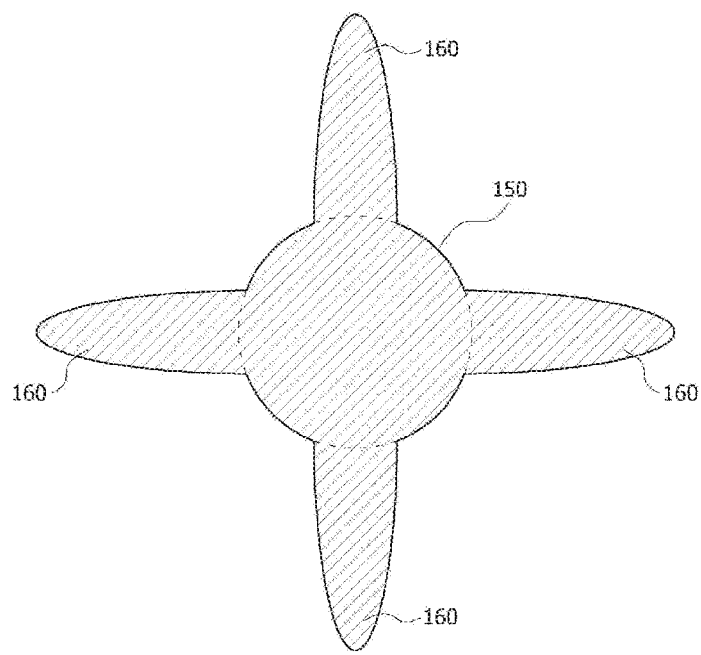
FIG. 3 is a top view of a column shown in FIG. 2 and elastic fins.
Figure 4A:
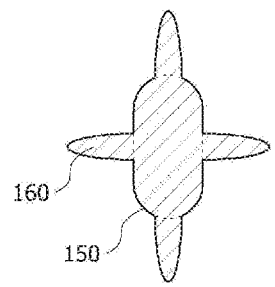
FIGS. 4a, 4b, 4c, 4d, 4e and 4f are top views showing modified embodiments of the column and the elastic fin.
Figure 4B:
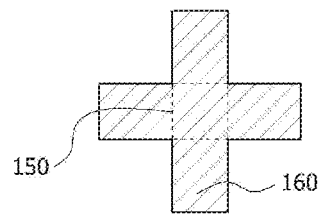
Figure 4C:
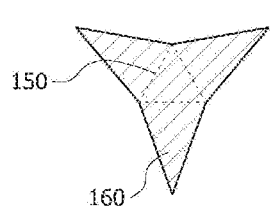
Figure 4D:
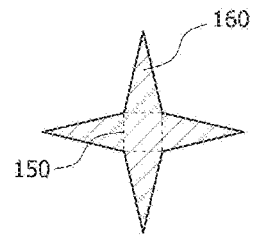
Figure 4E:
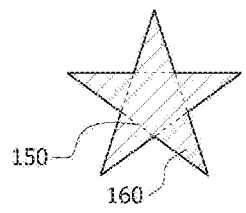
Figure 4F:
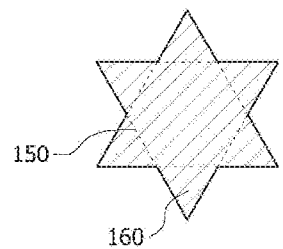

FIG. 3 is a top view of the column 150 shown in FIG. 2 and elastic fins 160. The elastic fins 160 have a surface made of a conductive material, and have a structure that extends outward from the column 150. The elastic fins 160 are configured to be elastically deformed and come in elastic contact with the inner conductive material 140 when the column 150 is inserted into the insert hole 113.

The elastic fins 160 may be configured to be bent in a direction opposite to an insertion direction of the column 150 when the column 150 is inserted into the insert hole 113. In this case, the elastic fins 160 may be formed integrally with the column 150, or may be configured to be formed on the column 150 as a separate layer.

The elastic fins 160 may be formed of an elastically deformable conductive material (for example, a metal material), or may be formed by coating a surface of an elastically deformable material (a polymer, a fiber, etc.) with a conductive material (for example, a metal). When the elastic fins 160 have a structure in which the elastically deformable material is coated with the conductive material, the elastic fins 160 may be manufactured by coating the entire surface or an upper or lower surface of a polymer sheet with a conductive metal such as copper.

The plurality of elastic fins 160 are preferably provided to come in contact with the inner conductive material 140 at a plurality of positions. As shown in FIG. 3, the plurality of elastic fins 160 may have a shape such that the elastic fins 160 are arranged to be space apart at a predetermined angle in an outer circumferential direction of the column 150. FIG. 3 illustrates a configuration in which four elastic fins 160 are arranged at 90° angles. However, the number and shape of the elastic fins 160 may be realized to vary to a wide extent. For example, the plurality of elastic fins 160 may be provided, or the elastic fin 160 may be singly provided in a ring shape (a circular shape).

Meanwhile, FIG. 3 illustrates that the cross section of the column 150 is in a circular shape, and the cross section of the elastic fins 160 is in a rod shape with a round tip. However, the configurations of the column 150 and the elastic fins 160 may be realized in different shapes.

FIGS. 4a-4f are top views showing modified embodiments of the column 150 and the elastic fins 160. As shown in FIGS. 4a-4f, the column 150 may have oval, triangular, rectangular, pentagonal, and hexagonal cross sections in addition to the circular cross section shown in FIG. 3. In addition, the elastic fins 160 may also have rectangular and triangular shapes in addition to the shape shown in FIG. 3. Further, the shapes of the column 150 and the elastic fins 160 applied to the present invention are not limited to the shapes described above in the exemplary embodiments, and may be realized in various different shapes. Also, when the column 150 and the elastic fins 160 are realized in different shapes, the insert hole 113 may also be realized in a shape corresponding to the shapes of the column 150 and the elastic fins 160.

Meanwhile, an aspect ratio (a ratio between the width and the height) of the column 150, a ratio between the length of the elastic fins 160 and the height of the column 150, a ratio between the length of the elastic fins 160 and the depth of the insert hole 113, and the like may be set in various forms.

Hereinafter, an operating state of the matable and dematable electrical connecting structure according to this exemplary embodiment will be described.

The column 150 of the male coupling member 120 may be inserted into the insert hole 113 of the female coupling member 110 to couple the female coupling member 110 and the male coupling member 120, as shown in FIG. 2, in a state in which the female coupling member 110 and the male coupling member 120 are separated from each other, as shown in FIG. 1. In a process of inserting the column 150 into the insert hole 113, the elastic fins 160 are elastically deformed by pressing the elastic fins 160 against the inner conductive material 140 provided on the inner wall of the insert hole 113. As a result, the elastic fins 160 come in elastic contact with the inner conductive material 140 due to a restoring force generated at the elastic fins 160. The elastic restoring force acts as a coupling force between the female coupling member 110 and the male coupling member 120 to prevent the female coupling member 110 and the male coupling member 120 from being separated in a random manner.

Meanwhile, as the elastic fins 160 electrically connected to the second connecting portion of the male coupling member 120 come in contact with the inner conductive material 140 electrically connected to the first connecting portion of the female coupling member 110, the electrical connection between the first connecting portion and the second connecting portion is possible.

According to the matable and dematable electrical connecting structure configured thus, many electrical connecting structures may be disposed in a narrow space, thereby realizing a fine pitch. An additional physical connecting structure need not be installed since an electrical connecting structure and a physical connecting structure are realized together. Also, the total thickness of the connecting structure may be reduced since the electrical connecting structure is realized inside the female coupling member 110.

Further, since the female coupling member 110 and the male coupling member 120 are autonomously aligned in an X-Y direction (a horizontal direction) by means of an elastic force of the elastic fins 160 when the female coupling member 110 and the male coupling member 120 are coupled to each other, no additional guide structure is required to align the female coupling member 110 and the male coupling member 120 in an X-Y direction. Also, the stable electrical connection may be maintained even when the female coupling member 110 and the male coupling member 120 are not coupled exactly in parallel with each other, or slight distortion between the female coupling member 110 and the male coupling member 120 occurs due to external impacts.

Also, when the female coupling member 110 and the male coupling member 120 are detached for repair, the female coupling member 110 and the male coupling member 120 may be easily separated through elastic deformation of the elastic fins 160, and re-used after the repair is completed.

Figure 6:
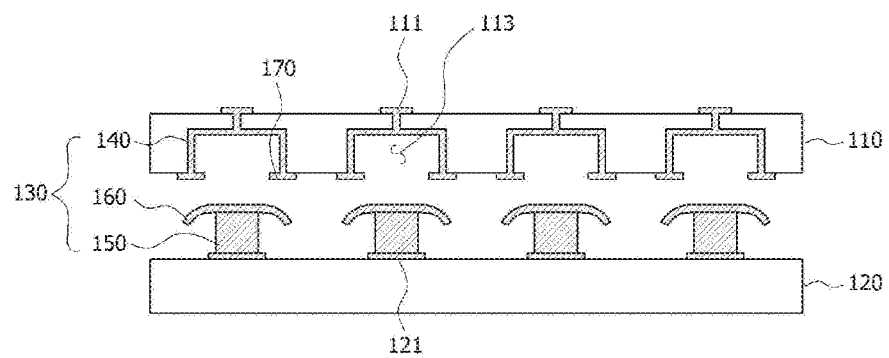
FIGS. 6 and 7 are cross-sectional views showing an electrical connecting structure according to a second exemplary embodiment of the present invention.
Figure 7:
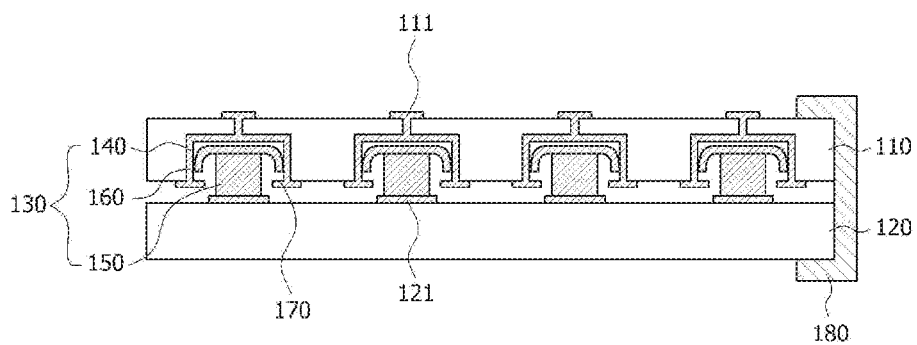

FIGS. 6 and 7 are cross-sectional views showing a matable and dematable electrical connecting structure according to a second exemplary embodiment of the present invention.

The matable and dematable electrical connecting structure according to this exemplary embodiment has a structure in which a protrusion 170 and a clamp 180 are further provided in the configuration according to the first exemplary embodiment. Since the matable and dematable electrical connecting structure according to this exemplary embodiment has the same configuration as the first exemplary embodiment except the retainer 170 and the clamp 180, a description of the same configuration is omitted for clarity.

FIG. 6 shows the female coupling member 110 and the male coupling member 120 in a separated state, and FIG. 7 shows the female coupling member 110 and the male coupling member 120 in a coupled state.

The retainer 170 is formed at an entrance of the insert hole 113, and is configured such that the elastic fins 160 can be hung thereon when the column 150 is inserted into the insert hole 113. The retainer 170 may be formed to project from the inner wall of the inner conductive material 140 in a radial direction of the insert hole 113, and may also be formed consecutively in an inner circumferential direction of the insert hole 113. According to such a configuration, the retainer 170 supports lower portions of the elastic fins 160, and thus may prevent the column 150 from being detached from the insert hole 113 due to external impacts.

The retainer 170 may be formed by laminating a polymer on the entrance of the insert hole 113, or stacking a polymer sheet on the entrance of the insert hole 113, and processing an aperture.

The clamp 180 is configured to clamp external surfaces of the female coupling member 110 and the male coupling member 120 so as to fix a coupled state of the female coupling member and the male coupling member. The clamp 180 has a structure for firmly fixing the coupled state of the female coupling member 110 and the male coupling member 120, and thus may be realized in any shape as long as the clamp 180 is configured to clamp the external surfaces of the female coupling member 110 and the male coupling member 120.

This exemplary embodiment illustrates a structure in which both the retainer 170 and the clamp 180 are applied. However, any one of the retainer 170 and the clamp 180 may be applied to the structure. The configurations of the retainer 170 and the clamp 180 described in this exemplary embodiment apply to exemplary embodiments to be described below.

Figure 8:
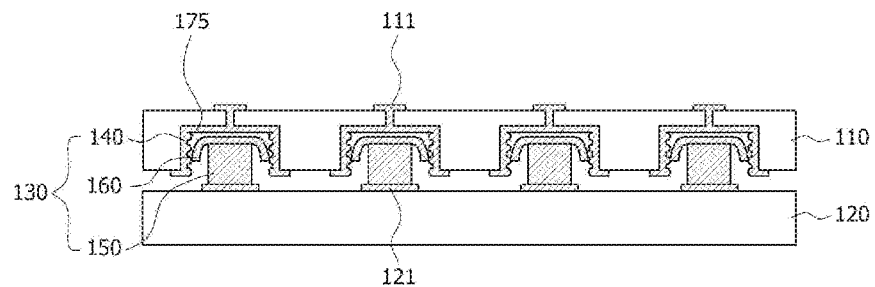
FIG. 8 is a cross-sectional view showing an electrical connecting structure according to a third exemplary embodiment of the present invention.

FIG. 8 is a cross-sectional view showing a matable and dematable electrical connecting structure according to a third exemplary embodiment of the present invention.

The matable and dematable electrical connecting structure according to this exemplary embodiment has a structure in which projections 175 are further provided in the configuration according to the first exemplary embodiment. Since the matable and dematable electrical connecting structure according to this exemplary embodiment has the same configuration as the first exemplary embodiment except the projections 175, a description of the same configuration is omitted for clarity.

The projections 175 are formed to project from the inner wall of the inner conductive material 140. The plurality of projections 175 may be formed in an inner circumferential direction of the insert hole 113, or a longitudinal direction of the insert hole 113. In this case, the inner wall of the inner conductive material 140 may be formed in an uneven structure due to the presence of the projections 175.

Since the elastic fins 160 and the inner conductive material 140 are firmly adhered to each other due to the uneven structure of the inner conductive material 140 when the column 150 is inserted into the insert hole 113, a coupling force between the female coupling member 110 and the male coupling member 120 may be further enhanced.

Figure 9:
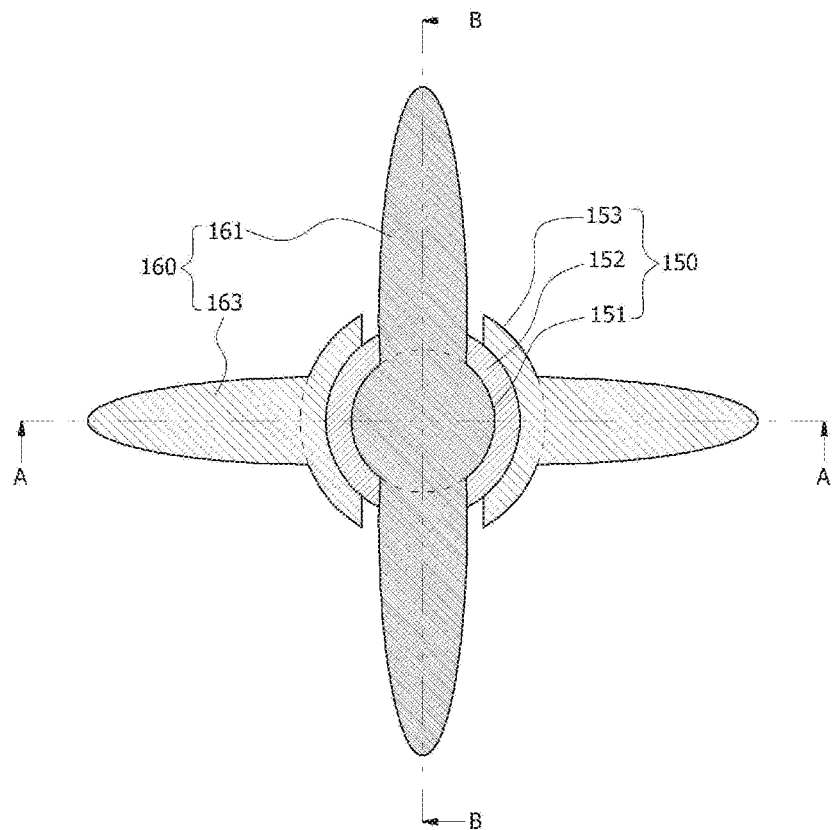
FIGS. 9, 10, 11 and 12 show an electrical connecting structure according to a fourth exemplary embodiment of the present invention.
Figure 10:
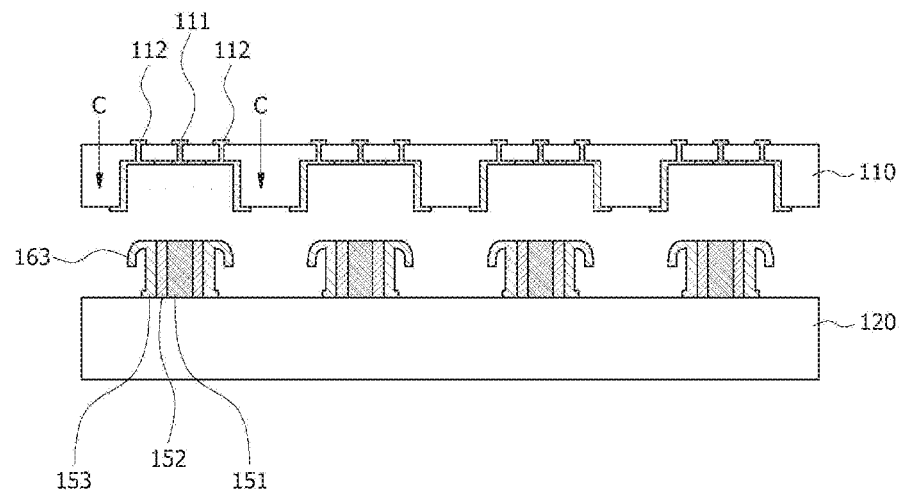
Figure 11:
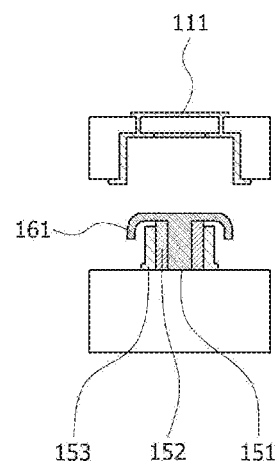
Figure 12:
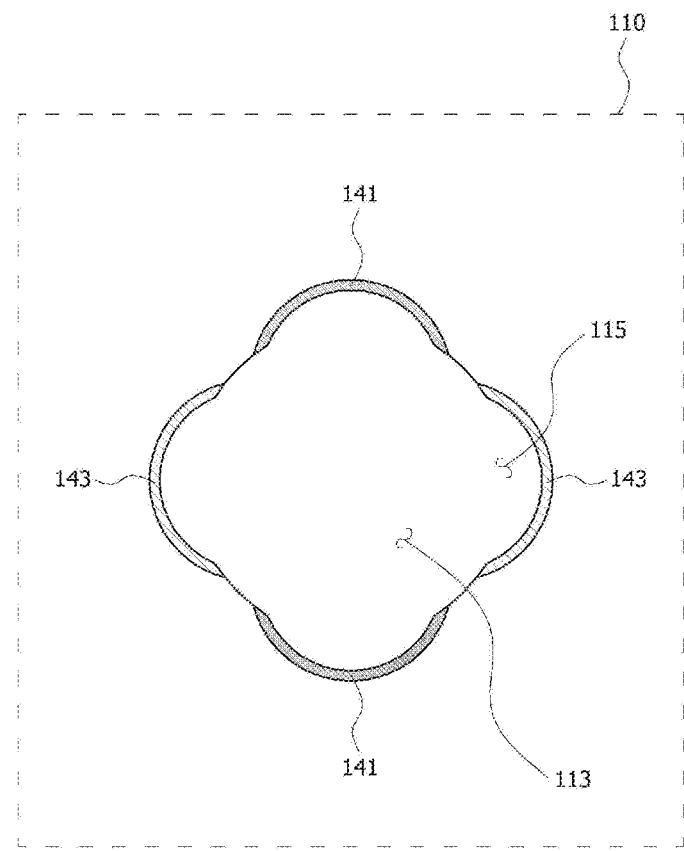

FIGS. 9, 10, 11 and 12 show a matable and dematable electrical connecting structure according to a fourth exemplary embodiment of the present invention. Specifically, FIG. 9 is a top view of a column and elastic fins according to this exemplary embodiment of the present invention, and FIG. 10 is a cross-sectional view of the matable and dematable electrical connecting structure taken along the A-A line shown in FIG. 9. Also, FIG. 11 is a cross-sectional view of the matable and dematable electrical connecting structure taken along the B-B line shown in FIG. 9, and FIG. 12 is a cross-sectional view of the matable and dematable electrical connecting structure taken along the C-C line shown in FIG. 10.

The matable and dematable electrical connecting structure according to this exemplary embodiment has a different configuration from the first to third exemplary embodiments described above for the configurations of the column, the elastic fin, and the inner conductive material. Thus, a description of the same configurations as in the above-described exemplary embodiments will be omitted for clarity.

According to this exemplary embodiment, the column 150 is configured to include a central conductive material 151, an insulating layer 152, and an outer conductive layer 153.

The central conductive material 151 is configured to project from the male coupling member 120, and the insulating layer 152 is configured to be formed on an outer circumference of the central conductive material 151. The outer conductive layer 153 has a structure for being formed on an outer circumference of the insulating layer 152, and the column 150 has a concentric cross section. In this aspect, the connecting structure according to this exemplary embodiment may be referred to as a coaxial-type connecting structure.

The central conductive material 151 and the outer conductive layer 153 may be connected to signal and ground electrodes provided in the male coupling member 120, respectively. The insulating layer 152 may function to electrically insulate between the central conductive material 151 and the outer conductive layer 153.

The elastic fins 160 are configured to include one or more signal fins 161 connected to the central conductive material 151, and one or more ground fins 163 connected to the outer conductive layer 153. Each of the signal fins 161 and the ground fins 163 is configured to extend outward from the central conductive material 151. As shown in FIG. 9, the signal fins 161 and the ground fins 163 may be alternately disposed to be spaced apart at a predetermined angle in an outer circumferential direction of the central conductive material 151. FIG. 9 illustrates a configuration in which the number of each of the signal fins 161 and the ground fins 163 is 2, that is, a configuration in which the signal fins 161 and the ground fins 163 are disposed to be spaced apart at 90° angles. However, a configuration in which the number of each of the signal fins 161 and the ground fins 163 is greater than 2 is possible.

Referring to FIGS. 9, 10, 11 and 12, the inner conductive material 140 is configured to include first conductive materials 141 and second conductive materials 143. The first conductive materials 141 and the second conductive materials 143 may be positioned at positions corresponding to the signal fins 161 and the ground fins 163, respectively, and may be disposed to be spaced apart from each other at a predetermined interval (angle). FIG. 12 illustrates a configuration in which the number of each of the first conductive materials 141 and the second conductive materials 143 is 2 like the signal fins 161 and the ground fins 163, that is, a configuration in which the first conductive materials 141 and the second conductive materials 143 are spaced apart at 90° angles. However, the number and spacing distances of the signal fin and ground fins 163, the first conductive materials 141 and the second conductive materials 143 may be realized to vary to various extents when necessary.

Referring to FIGS. 10, 11 and 12, the first conductive materials 141 and the second conductive materials 143 are connected to a first pad 111 and second pad 112 formed on a top surface of the female coupling member 110, respectively.

The first conductive materials 141 and the second conductive materials 143 may be formed on a plurality of recesses 115 formed on an inner circumference of the insert hole 113 to a predetermined thickness. As the column 150 is inserted into the insert hole 113, the first fins 161 and the second fins 163 come in elastic contact with the first conductive materials 141 and the second conductive materials 143, respectively.

The signal fins 161 function to transmit a signal between the female coupling member 110 and the male coupling member 120, and the ground fins 163 are electrically connected to the ground so as to functions as the ground. The ground fins 163 are disposed around the signal fins 161 so as to function to minimize signal interference between the plurality of arranged signal fins 161. According to this exemplary embodiment, a large number of signal transmission structures may be aligned in a narrow space, and an effect of preventing the signal interference may also be maximized by realizing the signal transmission structure and the ground structure as concentric structures.

Figure 13:
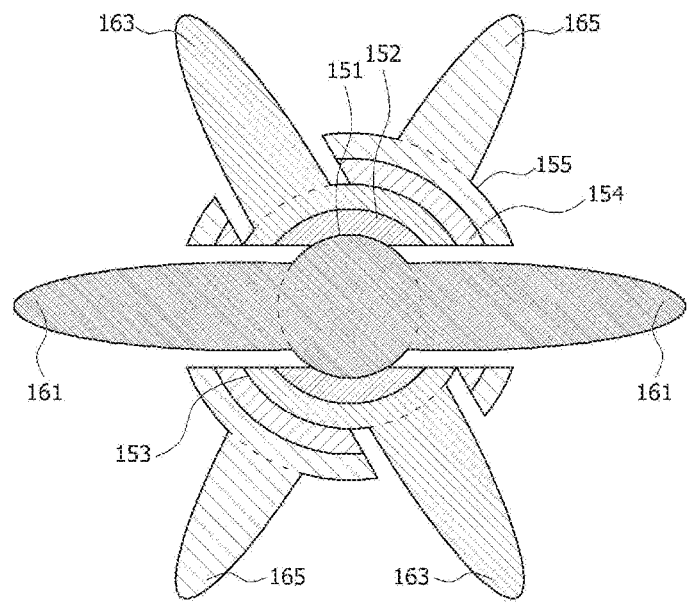
FIGS. 13 and 14 show an electrical connecting structure according to a fifth exemplary embodiment of the present invention.
Figure 14:
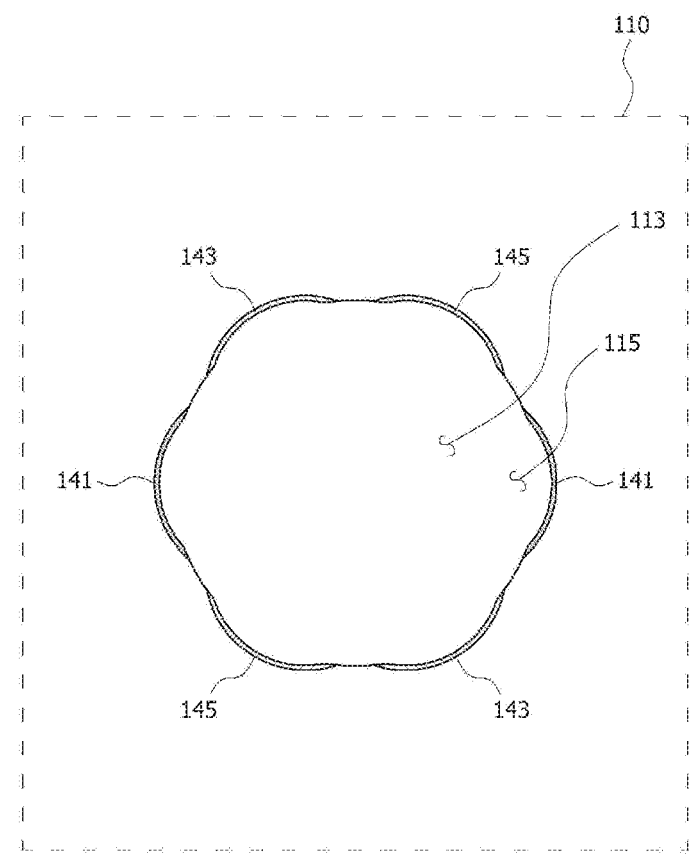

FIGS. 13 and 14 show a matable and dematable electrical connecting structure according to a fifth exemplary embodiment of the present invention. Specifically, FIG. 13 is a top view of a column and elastic fins according to this exemplary embodiment of the present invention, and FIG. 14 is a cross-sectional view showing the cross section of an inner conductive material.

According to this exemplary embodiment, the column 150 is configured to include a central conductive material 151, a first insulating layer 152, an outer conductive layer 153, a second insulating layer 154, and the outermost conductive layer 155.

The column 150 has a configuration in which the central conductive material 151, the first insulating layer 152, the outer conductive layer 153, the second insulating layer 154, and the outermost conductive layer 155 are sequentially formed concentrically, like the third exemplary embodiment. That is, the column 150 has a configuration in which the second insulating layer 154 and the outermost conductive layer 155 are further formed in the configuration according to the third exemplary embodiment. Here, the first insulating layer 152 functions to electrically isolate between the central conductive material 151 and the outer conductive layer 153, and the second insulating layer 154 functions to electrically isolate between the outer conductive layer 153 and the outermost conductive layer 155.

The elastic fins 160 are configured to include one or more signal fins 161 connected to the central conductive material 151, one or more ground fins 163 connected to the outer conductive layer 153, and one or more power fins 165 connected to the outermost conductive layer 155. The signal fins 161, the ground fins 163, and the power fins 165 may be alternately disposed to be spaced apart at a predetermined angle in an outer circumferential direction of the central conductive material 151, as shown in FIG. 12. FIG. 13 illustrates a configuration in which the number of each of the signal fins 161, the ground fins 163, and the power fins 165 is 2, that is, a configuration in which the signal fins 161, the ground fins 163, and the power fins 165 are disposed to be spaced apart at 60° angles.

Referring to FIG. 14, the inner conductive material 140 is configured to include first conductive materials 141, second conductive materials 143, and third conductive materials 145 corresponding to the signal fins 161, the ground fins 163, and the power fins 165, respectively. FIG. 14 illustrates a configuration in which the number of each of the first conductive materials 141 to the third conductive materials 145 is 2 like the signal fins 161, the ground fins 163, and the power fins 165, that is, a configuration in which the first conductive materials 141 to the third conductive materials 145 are spaced apart at 60° angles. However, the number and spacing distances (angles) of the signal fins 161, the ground fins 163, the power fins 165, and the first conductive materials 141 to the third conductive materials 145 may be realized to vary to various extents when necessary.

The matable and dematable electrical connecting structure according to this exemplary embodiment has a structure in which transfer of electric power by the power fins 165 is further added to the electrical connecting structure according to the fourth exemplary embodiment. Here, the matable and dematable electrical connecting structure has technical characteristics in that the prevention of the signal interference and the transfer of electric power are realized in one electrical connecting structure.

Hereinafter, an applied embodiment of the above-described matable and dematable electrical connecting structure will be described.

Figure 15:
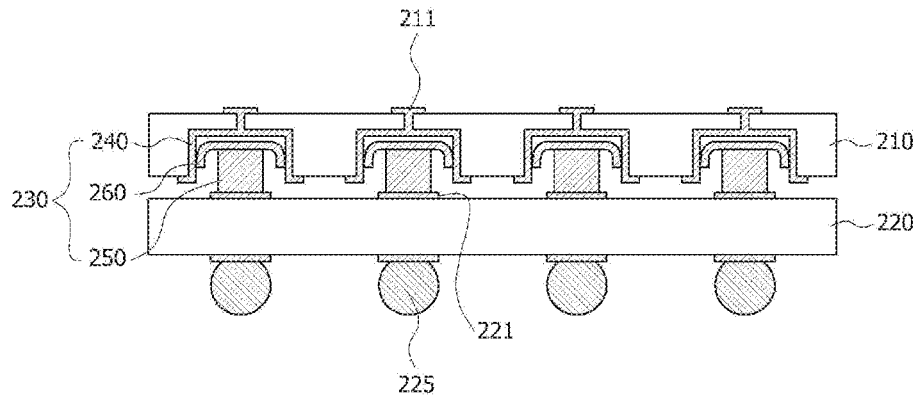
FIG. 15 is a cross-sectional view of a connector for electrical connection to which the matable and dematable electrical connecting structure relevant to the present invention is applied.

FIG. 15 is a cross-sectional view showing a connector for electrical connection to which the matable and dematable electrical connecting structure relevant to the present invention is applied.

The connector for electrical connection according to this exemplary embodiment serves to electrically connect between different substrates (hereinafter referred to as a first substrate and a second substrate). In this case, the first substrate and the second substrate are used as the concept of encompassing substrates in various shapes, such as rigid substrates or soft substrates, regardless of the shapes and types of the substrates.

Referring to FIG. 15, a connector configured to connect substrates is configured to include a female coupling member 210 having a first connecting portion, a male coupling member 220 having a second connecting portion, and a connecting unit 230 configured to couple the female coupling member 210 and the male coupling member 220 and electrically connect the first and second connecting portions.

The first connecting portion is electrically connected to the first substrate, and the second connecting portion is electrically connected to the second substrate. This exemplary embodiment illustrates a pad 211 formed on a top surface of the female coupling member 210 as the first connecting portion, and also illustrates a circuit pattern connected to a pad 221 formed on a top surface of the male coupling member 220 as the second connecting portion. The circuit pattern is electrically connected to the connecting structure such as a solder ball 225, which is formed on a bottom surface of the male coupling member 220, through a structure such as a via hole. The pad 211 of the female coupling member 210 and the solder ball 225 of the male coupling member 220 are physically/electrically connected to the first substrate and the second substrate, respectively.

The connecting unit 230 is configured to include an inner conductive material 240, a column 250, and elastic fins 260. Here, as the female coupling member 210 and the male coupling member 220 are connected so that the elastic fins 260 come in elastic contact with the inner conductive material 240, the first substrate and the second substrate are electrically connected to each other.

This exemplary embodiment illustrates a structure of the connector configured to connect the first substrate and the second substrate, that is, illustrates that a connecting structure for PCBs according to the first exemplary embodiment is applied to the connector. Since the connecting unit 230 has the same configuration as in the first exemplary embodiment, a description of the connecting unit 230 is omitted for clarity.

Figure 16:
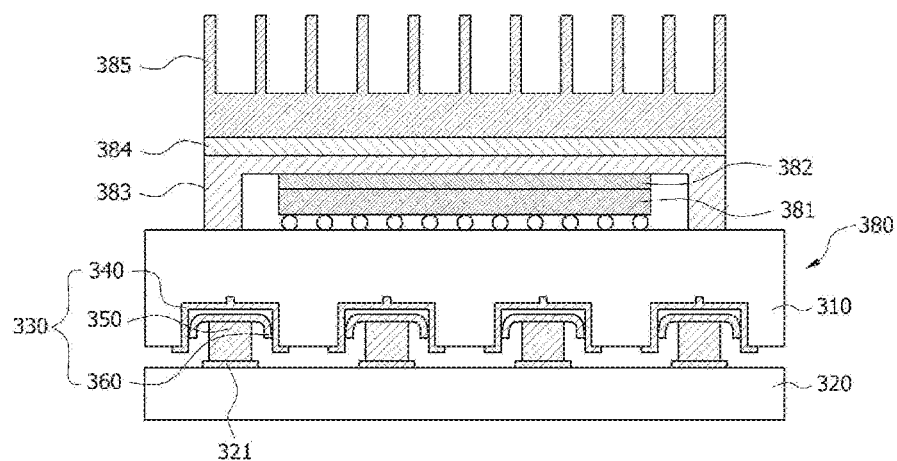
FIGS. 16 and 17 are cross-sectional views of a semiconductor package assembly to which the matable and dematable electrical connecting structure relevant to the present invention is applied.

FIG. 16 is a cross-sectional view showing a semiconductor package assembly to which the matable and dematable electrical connecting structure relevant to the present invention is applied.

This exemplary embodiment illustrates a configuration of a microprocessor package as one example of the semiconductor package. However, the semiconductor package to which the present invention is applied includes semiconductor packages having various shapes, such as 2.5D, and 3D packages, package-on-package (PoP), etc., but the present invention is not limited thereto.

According to this exemplary embodiment, the semiconductor package assembly includes a semiconductor package 380, a main board 320, and a connecting unit 330.

The semiconductor package 380 is configured to include a semiconductor element 381, and a package substrate 310 in which the semiconductor element 381 is mounted. A heat diffuser 383 is installed outside the semiconductor element 381, and a first heat transfer material 382 is interposed between the semiconductor element 381 and the heat diffuser 383. A heat sink 385 is installed above the heat diffuser 383, and a second heat transfer material 384 is interposed between the heat sink 385 and the heat diffuser 383.

The main board 320 refers to a main substrate in which the semiconductor package 380 is mounted, and the connecting unit 330 functions to couple the semiconductor package 380 and the main board 320 and also electrically connect a circuit of the substrate 310 and a circuit of the main board 320.

The connecting unit 330 is configured to include an inner conductive material 340, a column 350, and elastic fins 360. In this case, the inner conductive material 340 is provided on the package substrate 310, and the column 350 is formed on the main board 320. This exemplary embodiment illustrates that the connecting structure for PCBs according to the first exemplary embodiment is applied as a connecting structure of the semiconductor package 380 and the main board 320. Since the connecting unit 330 has the same configuration as in the first exemplary embodiment, a description of the connecting unit 330 is omitted for clarity.

Figure 17:
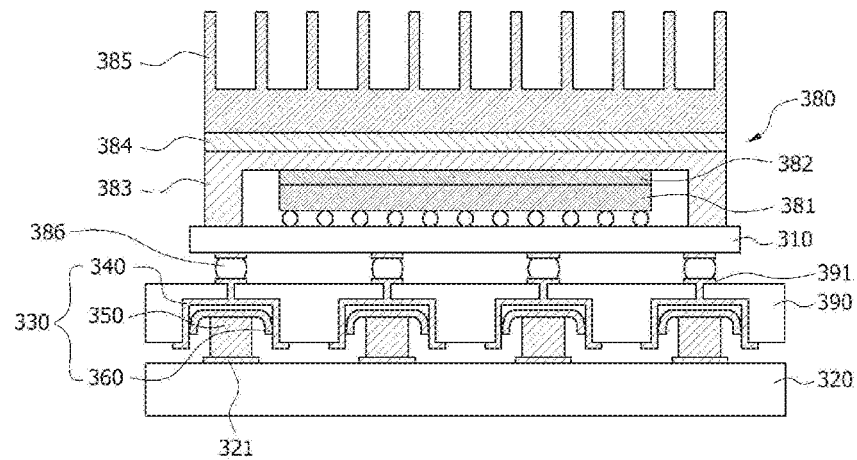

FIG. 17 is a cross-sectional view showing another exemplary embodiment of the semiconductor package assembly shown in FIG. 16.

The semiconductor package assembly according to this exemplary embodiment is configured to include a semiconductor package 380, a main board 320, an interposer 390, and a connecting unit 330. That is, the semiconductor package assembly has a configuration in which the interposer 390 is further provided in the configuration according to the above-described exemplary embodiments.

The interposer 390 is installed between the semiconductor package 380 and the main board 320, and functions to connect a circuit of the package substrate 310 and a circuit of the main board 320. The interposer 390 and the package substrate 310 are electrically connected to each other by means of a connecting structure such as a solder ball 386.

The connecting unit 330 functions to couple the interposer 390 and the main board 320, and electrically connect a circuit 391 (or a pad) of the interposer 390 and a circuit of the main board 320.

As in the above-described exemplary embodiments, the connecting unit 330 is configured to include an inner conductive material 340, a column 350, and elastic fins 360. The inner conductive material 340 is provided in the interposer 390, and the column 350 is formed on the main board 320. This exemplary embodiment has an advantage in that, when the electrical connecting structure in which the interposer 390 is used is further applied, the conventional semiconductor package 380 may be used without additionally processing the substrate 310 of the semiconductor package 380.

Meanwhile, according to this exemplary embodiment, another interposer may be further installed between the interposer 390 and the main board 320. Here, the interposer 390 positioned at a higher position may be referred to as a first interposer, and the interposer 390 positioned at a lower position may be referred to as a second interposer. In this case, the inner conductive material 340 is provided on the first interposer, and the column 350 and the elastic fins 360 are provided on the second interposer. The second interposer is mounted on the main board 320 by means of the connecting structure such as a solder ball.

One exemplary embodiment in which the configuration of the first exemplary embodiment is applied as the electrical connecting structure of the connector configured to connect substrates, and the semiconductor package assembly with reference to the configurations shown in FIGS. 15 to 17, as described above. However, the configurations of the second to fifth exemplary embodiments may also be applied as the configurations of the connector for electrical connection and the semiconductor package assembly.

Figure 18:
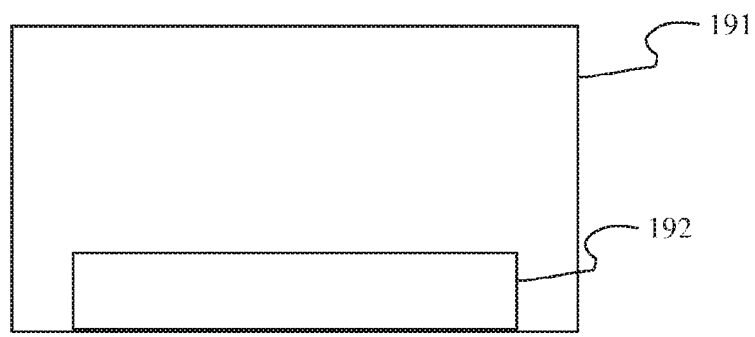
FIG. 18 is an example of an electronic device including a housing, according to some embodiments of the present invention.

Reference is now made to FIG. 18 which is an example of an electronic device including a housing, according to some embodiments of the present invention. Yet another aspect of the present invention provides an electronic device (190) including a housing (191) configured to form the exterior of the electronic device (190), and one of the matable and dematable electrical connecting structure, the connector for electrical connection, and the semiconductor package assembly, all of which are configured as described above (192), and installed inside the housing (191).

Further, the matable and dematable electrical connecting structure relevant to the present invention may be applied to various fields such as an interconnecting structure of a flip chip, an interconnecting structure between a capacitor of a multilayered ceramic capacitor (MLCC) and another element (or a substrate), etc., as well as the connector for electrical connection and semiconductor package assembly as described above.

As described above, the matable and dematable electrical connecting structure, and the connector for electrical connection, the semiconductor package assembly and the electronic device, all of which include the matable and dematable electrical connecting structure, are not limited to the configurations and methods according to the above-described exemplary embodiments. Some or all of the respective exemplary embodiments may be selectively combined so that various modifications and changes can be made to the exemplary embodiments, and the various modifications and changes may be made within the scope of the present invention by those skilled in the related art.

What is claimed is:
1. A matable and dematable electrical connecting structure comprising:
a female coupling member having a first connecting portion;
a male coupling member having a second connecting portion; and
a connecting unit configured to couple the female coupling member and the male coupling member and electrically connect the first and second connecting portions,
wherein the connecting unit comprises:
an inner conductive material electrically connected to the first connecting portion and provided on the inner wall of an insert hole formed in the female connecting member;
a column electrically connected to the second connecting portion, protruding from the male connecting member to be inserted into the insert hole, and comprising a conductive material; and
one or more elastic fins extending outward from the column to come in elastic contact with the inner conductive material and having a surface made of a conductive material, wherein one or more of the elastic fins are formed in a planar shape with one or more planar protrusions planarly extending outwardly from the planar shape, wherein the planar shape is attached to a longitudinal edge of the column, perpendicularly to a longitudinal axis of the column and distant from the male connecting member, and wherein one or more of the elastic fins are configured to be bent in a direction opposite to an insertion direction of the column when the column is inserted into the insert hole.

2. The matable and dematable electrical connecting structure of claim 1, wherein the female and male coupling members are formed of at least one selected from the group consisting of a ceramic, a polymer, silicone, glass, a metal, and a combination thereof.

3. The matable and dematable electrical connecting structure of claim 1, wherein the elastic fins are formed of an elastically deformable conductive material.

4. The matable and dematable electrical connecting structure of claim 1, wherein the elastic fins are formed by coating a surface of an elastically deformable material with a conductive material.

5. The matable and dematable electrical connecting structure of claim 1, wherein the elastic fins are formed at an outer circumference of the column in one circular shape, or the plurality of elastic fins have a shape such that the elastic fins are arranged to be spaced apart at a predetermined angle.

6. The matable and dematable electrical connecting structure of claim 1, wherein the insert hole has a shape such that the insert hole is recessed to a predetermined depth from one surface of the female coupling member, or has a shape of a through hole passing though the female coupling member.

7. The matable and dematable electrical connecting structure of claim 1, wherein the column comprises a central conductive material, a first insulating layer formed on an outer circumference of the central conductive material, and an outer conductive layer formed on an outer circumference of the first insulating layer, and each of the elastic fins comprises one or more signal fins connected to the central conductive material, and one or more ground fins connected to the outer conductive layer.

8. The matable and dematable electrical connecting structure of claim 7, wherein the signal fins and the ground fins are alternately disposed to be spaced apart at a predetermined angle in an outer circumferential direction of the central conductive material.

9. The matable and dematable electrical connecting structure of claim 7, wherein the inner conductive material comprises first and second conductive materials positioned at positions corresponding to the signal fin and the ground fin, respectively, and disposed to be spaced apart from each other at a predetermined interval.

10. The matable and dematable electrical connecting structure of claim 9, wherein the first and second conductive materials are formed on recesses formed on an inner circumference of the insert hole.

11. The matable and dematable electrical connecting structure of claim 7, wherein the column further comprises a second insulating layer formed on an outer circumference of the outer conductive layer, and an outermost conductive layer formed on an outer circumference of the second insulating layer, and each of the elastic fins further comprises one or more power fins for transfer of electric power connected to the outermost conductive layer.

12. The matable and dematable electrical connecting structure of claim 1, further comprising a retainer formed at an entrance of the insert hole and configured to hang the elastic fins when the insertion of the column into the inserto hole is completed.

13. The matable and dematable electrical connecting structure of claim 1, further comprising a clamp configured to clamp external surfaces of the female coupling member and the male coupling member so as to fix a coupled state of the female coupling member and the male coupling member.

14. The matable and dematable electrical connecting structure of claim 1, further comprising a plurality of protrusions configured to protrude from the inner wall of the inner conductive material so that unevenness is formed on the inner wall of the inner conductive material.

15. The matable and dematable electrical connecting structure of claim 1, wherein the female coupling member or the male coupling member comprises at least one selected from the group consisting of an active element, a passive element, a connector, an interposer applied to semiconductor packages, a semiconductor chip package, a semiconductor chip and package in the form of a 3D stacked structure shape, and a multilayered ceramic capacitor (MLCC).

16. An electronic device comprising:
a housing configured to form the exterior of the electronic device; and
the matable and dematable electrical connecting structure defined in claim 1 and installed inside the housing.

17. An electronic device comprising:
a housing configured to form the exterior of the electronic device; and
the matable and dematable electrical connecting structure defined in claim 2 and installed inside the housing.

18. An electronic device comprising:
a housing configured to form the exterior of the electronic device; and
the matable and dematable electrical connecting structure defined in claim 1 and installed inside the housing.

19. An electronic device comprising:
a housing configured to form the exterior of the electronic device; and
the matable and dematable electrical connecting structure defined in claim 3 and installed inside the housing.

20. An electronic device comprising:
a housing configured to form the exterior of the electronic device; and
the matable and dematable electrical connecting structure defined in claim 4 and installed inside the housing.

21. An electronic device comprising:
a housing configured to form the exterior of the electronic device; and
the matable and dematable electrical connecting structure defined in claim 5 and installed inside the housing.

22. An electronic device comprising:
a housing configured to form the exterior of the electronic device; and
the matable and dematable electrical connecting structure defined in claim 6 and installed inside the housing.

23. An electronic device comprising:
a housing configured to form the exterior of the electronic device; and
the matable and dematable electrical connecting structure defined in claim 7 and installed inside the housing.

24. An electronic device comprising:
a housing configured to form the exterior of the electronic device; and
the matable and dematable electrical connecting structure defined in claim 8 and installed inside the housing.

25. An electronic device comprising:
a housing configured to form the exterior of the electronic device; and
the matable and dematable electrical connecting structure defined in claim 9 and installed inside the housing.

26. An electronic device comprising:
a housing configured to form the exterior of the electronic device; and
the matable and dematable electrical connecting structure defined in claim 10 and installed inside the housing.

27. An electronic device comprising:
a housing configured to form the exterior of the electronic device; and
the matable and dematable electrical connecting structure defined in claim 11 and installed inside the housing.

28. An electronic device comprising:
a housing configured to form the exterior of the electronic device; and
the matable and dematable electrical connecting structure defined in claim 12 and installed inside the housing.

29. An electronic device comprising:
a housing configured to form the exterior of the electronic device; and
the matable and dematable electrical connecting structure defined in claim 13 and installed inside the housing.

30. An electronic device comprising:
a housing configured to form the exterior of the electronic device; and
the matable and dematable electrical connecting structure defined in claim 14 and installed inside the housing.

31. An electronic device comprising:
a housing configured to form the exterior of the electronic device; and
the matable and dematable electrical connecting structure defined in claim 15 and installed inside the housing.

32. A connector for electrical connection configured to electrically connect a first substrate and a second substrate, the connector comprising:
a female coupling member having a first connecting portion electrically connected to the first substrate;
a male coupling member having a second connecting portion electrically connected to the second substrate; and
a connecting unit configured to couple the female coupling member and the male coupling member, and electrically connect the first and second connecting portions,
wherein the connecting unit comprises:
an inner conductive material electrically connected to the first connecting portion and provided on the inner wall of an insert hole formed in the female coupling member;

a column electrically connected to the second connecting portion, protruding from the male connecting member to be inserted into the insert hole, and comprising a conductive material; and one or more elastic fins extending outward from the column to come in elastic contact with the inner conductive material and having a surface made of a conductive material, wherein one or more of the elastic fins are formed in a planar shape with one or more planar protrusions planarly extending outwardly from the planar shape, wherein the planar shape is attached to a longitudinal edge of the column, perpendicularly to a longitudinal axis of the column and distant from the male connecting member, and wherein one or more of the elastic fins are configured to be bent in a direction opposite to an insertion direction of the column when the column is inserted into the insert hole.

33. An electronic device comprising:

a housing configured to form the exterior of the electronic device; and the connector for electrical connection defined in claim 32 and installed inside the housing.

34. A semiconductor package assembly comprising:

a semiconductor package comprising a semiconductor element and a package substrate on which the semiconductor element is mounted;

a main board on which the semiconductor package is mounted; and a connecting unit configured to couple the semiconductor package and the main board and electrically connect a circuit of the substrate and a circuit of the main board, wherein the connecting unit comprises:

an inner conductive material electrically connected to the circuit of the substrate and provided on the inner wall of an insert hole formed in the substrate;

a column electrically connected to the circuit of the main board, protruding from the main board to be inserted into the insert hole, and comprising a conductive material; and one or more elastic fins extending outward from the column to come in elastic contact with the inner conductive material, and having a surface made of a conductive material, wherein one or more of the elastic fins are formed in a planar shape with one or more planar protrusions planarly extending outwardly from the planar shape, wherein the planar shape is attached to a longitudinal edge of the column, perpendicularly to a longitudinal axis of the column and distant from the male connecting member, and wherein one or more of the elastic fins are configured to be bent in a direction opposite to an insertion direction of the column when the column is inserted into the insert hole.

35. An electronic device comprising:

a housing configured to form the exterior of the electronic device; and the semiconductor package assembly defined in claim 34 and installed inside the housing.

36. A semiconductor package assembly comprising:

a semiconductor package comprising a semiconductor element and a package substrate on which the semiconductor element is mounted;

a main board on which the semiconductor package is mounted;

an interposer installed between the semiconductor package and the main board and configured to connect a circuit of the substrate and a circuit of the main board; and a connecting unit configured to couple the interposer and the main board and electrically connect the circuit of the interposer and the circuit of the main board, wherein the connecting unit comprises:

an inner conductive material electrically connected to the circuit of the interposer and provided on the inner wall of an insert hole formed in the interposer;

a column electrically connected to the circuit of the main board, protruding from the main board to be inserted into the insert hole, and comprising a conductive material; and one or more elastic fins extending outward from the column to come in elastic contact with the inner conductive material and having a surface made of a conductive material, wherein one or more of the elastic fins are formed in a planar shape with one or more planar protrusions planarly extending outwardly from the planar shape, wherein the planar shape is attached to a longitudinal edge of the column, perpendicularly to a longitudinal axis of the column and distant from the male connecting member, and wherein one or more of the elastic fins are configured to be bent in a direction opposite to an insertion direction of the column when the column is inserted into the insert hole.

37. An electronic device comprising:

a housing configured to form the exterior of the electronic device; and the semiconductor package assembly defined in claim 36 and installed inside the housing.

38. A semiconductor package assembly comprising:

a semiconductor package comprising a semiconductor element and a package substrate on which the semiconductor element is mounted;

a main board on which the semiconductor package is mounted;

first and second interposers installed between the semiconductor package and the main board and configured to connect a circuit of the substrate and a circuit of the main board; and a connecting unit configured to couple the first interposer and the second interposer and electrically connect a circuit of the first interposer and a circuit of the second interposer, wherein the connecting unit comprises:

an inner conductive material electrically connected to the circuit of the first interposer and provided on the inner wall of an insert hole formed in the first interposer;

a column electrically connected to the circuit of the second interposer, protruding from the second interposer to be inserted into the insert hole, and comprising a conductive material; and one or more elastic fins extending outward from the column to come in elastic contact with the inner conductive material and having a surface made of a conductive material, wherein one or more of the elastic fins are formed in a planar shape with one or more planar protrusions planarly extending outwardly from the planar shape, wherein the planar shape is attached to a longitudinal edge of the column, perpendicularly to a longitudinal axis of the column and distant from the male connecting member, and wherein one or more of the elastic fins are configured to be bent in a direction opposite to an insertion direction of the column when the column is inserted into the insert hole.

39. An electronic device comprising:
a housing configured to form the exterior of the electronic device; and
the semiconductor package assembly defined in claim 38 and installed inside the housing.

* * * * *